United States Patent
Paulos et al.

(10) Patent No.: US 7,904,622 B2
(45) Date of Patent: Mar. 8, 2011

(54) DEVICE FOR WIRELESS TRANSMISSION OF DIGITAL INFORMATION

(76) Inventors: Thomas Paulos, Century City, CA (US); Brian Shamie, Los Angeles, CA (US)

( * ) Notice: Subject to any disclaimer, the term of this patent is extended or adjusted under 35 U.S.C. 154(b) by 0 days.

(21) Appl. No.: 12/086,197

(22) PCT Filed: Dec. 6, 2006

(86) PCT No.: PCT/US2006/046784
§ 371 (c)(1),
(2), (4) Date: Jun. 6, 2008

(87) PCT Pub. No.: WO2007/120227
PCT Pub. Date: Oct. 25, 2007

(65) Prior Publication Data
US 2010/0199016 A1    Aug. 5, 2010

Related U.S. Application Data

(60) Provisional application No. 60/742,808, filed on Dec. 6, 2005.

(51) Int. Cl.
*G06F 13/14* (2006.01)

(52) U.S. Cl. ............ 710/74; 710/62; 709/217; 709/218; 709/219

(58) Field of Classification Search ......................... None
See application file for complete search history.

(56) References Cited

U.S. PATENT DOCUMENTS

| | | | | |
|---|---|---|---|---|
| 7,065,345 B2 * | 6/2006 | Carlton et al. | ............. | 455/414.1 |
| 7,085,814 B1 * | 8/2006 | Gandhi et al. | ............. | 709/208 |
| 7,296,098 B2 * | 11/2007 | Shih | ............. | 710/13 |
| 7,327,981 B2 * | 2/2008 | Hundal | ............. | 455/41.2 |
| 7,341,186 B2 * | 3/2008 | Mrozik et al. | ............. | 235/384 |
| 7,395,962 B2 * | 7/2008 | Barta et al. | ............. | 235/384 |
| 7,450,163 B2 * | 11/2008 | Rothschild | ............. | 348/231.2 |
| 7,456,872 B2 * | 11/2008 | Rothschild | ............. | 348/231.99 |
| 7,545,784 B2 * | 6/2009 | Mgrdechian et al. | ......... | 370/338 |
| 7,677,970 B2 * | 3/2010 | O'Kelley et al. | ............. | 463/25 |
| 7,797,204 B2 * | 9/2010 | Balent | ............. | 705/28 |
| 2002/0151327 A1 * | 10/2002 | Levitt | ............. | 455/556 |
| 2004/0073727 A1 * | 4/2004 | Moran et al. | ............. | 710/74 |
| 2004/0242216 A1 * | 12/2004 | Boutsikakis | ............. | 455/418 |
| 2005/0055368 A1 * | 3/2005 | Bruening et al. | ............. | 707/102 |
| 2006/0053238 A1 * | 3/2006 | Hung et al. | ............. | 710/62 |
| 2007/0010748 A1 * | 1/2007 | Rauch et al. | ............. | 600/481 |
| 2008/0247731 A1 * | 10/2008 | Yamauchi et al. | ............. | 386/95 |

OTHER PUBLICATIONS

Amir, Buddy Tracking—Efficient Proximity Detection Among Mobile Friends, 2004, IEEE, pp. 1-12.*

* cited by examiner

*Primary Examiner* — Cheng-Yuan Tseng

(57) ABSTRACT

Disclosed is to a USB device for receiving data from other data transmitting devices. The inventive USB device comprises a printed circuit board having a microprocessor and memory, a USB controller connected to the microprocessor, a USB connector connected to the printed circuit board, and wireless receiving means connected to the printer circuit board for receiving external data to be stored in the memory. The data stored in the memory include, but are not limited to, unique identifiers from external devices. The inventive USB device may further comprise means for transmitting data from the device to external devices. The inventive USB has a power source to provide power for it to work for an extended period of time. The above inventive USB device may further provide means for a user to initiate the device to transmit the ID to other receiving devices within the proximity.

17 Claims, 7 Drawing Sheets

FIGURE 7

| | NAME | COMPANY | TYPE | DATE AND TIME |
|---|---|---|---|---|
| 1. | MARY ELLERY | LIGHTCO | IND LIGHTING | 11/15/06 1:00 PM |
| 2. | STEVEN BROWN | SPECTRUM LIGHTING | IND LIGHTING | 11/16/06 10:00 AM |
| 3. | MAX KRAMER | BRITELITE | IND LIGHTING | 11/17/06 3:00 PM |
| 4. | | | | |
| 5. | | | | |
| 6. | | | | |

DEVICE FOR WIRELESS TRANSMISSION OF DIGITAL INFORMATION

CROSS REFERENCE TO RELATED APPLICATIONS

The present application claims the benefit of Provisional Application No. 60/742,808 filed Dec. 6, 2005, which is incorporated herein by reference.

BACKGROUND

Information on a subject (e.g., a person, a product, or a company), particularly marketing information, is extremely important to business, social, or personal interactions. One can generally separate such information into two categories. The first is information about an individual and this is provided by exchanging business cards containing basic contact information (e.g., a person's name, title, and contact information). This practice has been adopted into business and social practices over many generations and across different cultures. The other form of information is information about a company or a product. This information is usually printed on marketing materials such as brochures, CDs, and catalogs. Both forms of information exchange are limited by the following constraints.

First, each printed material (a business card, a catalog) is a consumable give-away item and therefore, does not provide the provider of the material with a mechanism to capture the recipient's information after each interaction. This means that the material might be misplaced, lost, or discarded and neither the provider nor recipient has an effective way of recovering the information lost. If a provider wishes to follow-up with the recipient, he is only able to do so if information on the recipient is available. Conversely, the recipient has no mechanism to obtain any of the information obtained from the provider if the material has been misplaced, lost, or discarded.

Second, information provided printed on materials is fixed after an exchange and thus cannot be altered after the material has been provided to the recipient. This means that the information printed cannot be updated to reflect any changes. Further, if information is printed incorrectly or changed after the information has been printed, then the materials need to be printed again with the new information. There is no current solution to update the information once the materials have been received. For example, information on business cards received by others will not reflect the change of information when an individual moves to a new company. Another example is inability of product catalogs to accurately reflect the availability of products and new unlisted products.

Third, the number of materials that can be provided to a recipient is limited by the physical availability of such material. This means that each provider can only distribute as many materials as he or she has available at one time. As a result, both the recipient and the provider are burdened with the need to carry a stack of his or her own materials and a stack of materials received from others.

Fourth, the type of information or the extensiveness of the information cannot be customized for each recipient. Therefore, the type of information provided and the level of detail for each material is the same for all recipients unless the provider wishes to carry different stacks of materials comprising different information that target different groups of recipients.

Fifth, the extent of information provided to each recipient is limited by what has been printed on each material. The material itself has a limited space or area printing of information.

Finally, business cards and marketing materials are consumables that burden the provider with the cost and time in generating these materials but become virtually useless to the recipient once the information is stored digitally or is no longer relevant.

There remains a need for a cost-effective and environmentally friendly solution that enables a convenient way to send and receive data between similar devices that provides the following advantages: 1) a mechanism for a user to reach the other user whom he exchanged information with even if he lost or misplaced the device 2) a method for a user to effectively update the information after it has been provided to a recipient in the initial interaction 3) not limited by the physical availability of printed materials and not burdened with the need to carry such materials 4) flexibility in type of data exchanged and extensiveness of data exchange 5) ability to customize information provided to a recipient subsequent to the exchange of data.

Currently USB devices, such as mass storage devices, are used for storing and transferring data. Besides story and transferring data, USB devices have been modified to serve various functions. Some exhibitors at meetings and conferences are handing out mass storage devices as marketing materials. Because USB devices are widely used, it is therefore preferable to adapt a USB device and variations thereof to meet some the needs described above.

SUMMARY

An embodiment of the invention is directed to a USB device for receiving data from other data transmitting devices, referenced herein as the inventive USB device. The inventive USB device has many advantages, including 1) a mechanism for a user to reach the other user whom he exchanged information with even if he lost or misplaced the device 2) a method for a user to effectively update the information after it has been provided to a recipient in the initial interaction 3) not limited by the physical availability of printed materials and not burdened with the need to carry such materials 4) flexibility in type of data exchanged and extensiveness of data exchange 5) ability to customize information provided to a recipient subsequent to the exchange of data. It should be noted that while it is desirable that the inventive USB device has the above listed advantages, not all the advantages need to be incorporated into every embodiment of the invention.

The inventive USB device comprises a printed circuit board having a microprocessor and memory, a USB controller connected to the microprocessor, a USB connector connected to the printed circuit board, and wireless receiving means connected to the printer circuit board for receiving external data to be stored in the memory. The data stored in the memory include, but are not limited to, unique identifiers from external devices. The inventive USB device may further comprise means for transmitting data from the device to external devices. For its receiving and transmission means, the device has a transceiver such as an infrared transceiver or a radio frequency transceiver. The inventive USB has a power source to provide power for it to work for an extended period of time. This power source can be a battery, rechargeable from the power from the USB connection, a solar cell, or functional equivalents. The above inventive USB device may further provide means for a user to initiate the device to transmit the ID to other receiving devices within the proximity. An example of such means for initiating is a button on the inventive USB device for a user to initiate the transmission by pushing the button. Examples of other receiving devices include cellular phones, personal digital assistants (PDAs), personal computers, personal information managers, bard-coding and ID tagging systems, or visual terminals. The inventive USB device may be modified into a USB mass storage device.

The inventive USB device described above may further provide user feedback means, such as an indicator on the device, to report to the user when a unique identifier (ID) from another inventive USB device has been successfully received. The inventive USB device may further provide additional feedback means to report to the user the inventive USB device's internal state that affects its ability to function. Examples of these conditions include lack of storage on the inventive USB device, inventive USB device malfunction, or that the power source is low in power. Such indicator is also interfaced with the microprocessor through the data bus and may be audio or visual. A visual indicator may be a small light, such as a LED that can flash, and other functional equivalents thereof that serves the same reporting mechanism. An audio indicator may be a low power audio device such as a pesio-electric device that can beep, and other functional equivalents thereof that serves the same reporting mechanism. A tactile indicator may be an electric device that cause vibration, and other functional equivalents thereof that serves the same reporting mechanism.

The inventive USB device has the combined components on a printed circuit board, as described in FIG. 3. An illustration of the inventive USB device is available in FIG. 1 and FIG. 2 where the majority of the functional components described in FIG. 3 are encapsulated by an external case.

A second embodiment of the invention is directed to a method comprising the steps of: 1) receiving data via wireless means in a USB device having a USB connector and a USB controller from other data transmitting devices, 2) uploading the data stored in the USB device to a client computer, such as a personal computer, by a physical connection approach or a wireless communication approach. The data stored include but not limited to unique identifiers. The physical connection for uploading the stored data include joining the USB connector on the USB device with a USB port on a client computer or joining the USB connector on the USB device to a USB cable connected to the client computer. The method may further include associating the uploaded data in the client computer to information associated with each ID wherein the associated information is stored in a database or a remote server. The method may further include 3) transmitting the USB device's ID to other data receiving devices.

DESCRIPTION OF THE DRAWINGS

These and other features, aspects, and advantages of the present invention will become better understood with to the following description, appended claims, and accompanying drawings where:

FIG. 7 shows the information to be retrieved by a user once the unique identifiers collected on an inventive USB device has been associated with the information relating to each unique identifier.

DESCRIPTION

Definitions

Figure 2:
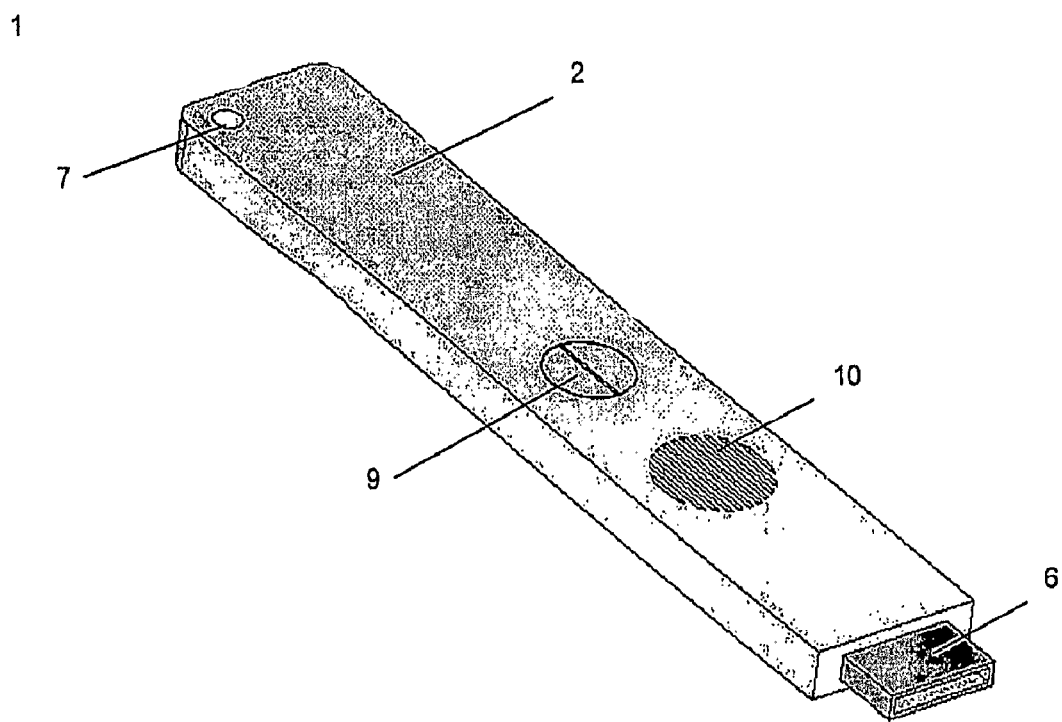
FIG. 2 provides a perspective back view of inventive USB device (1). In this view, the battery closure (9) is displayed. Further, an audio indicator (10) is provided. This view provides a more detailed illustration of the USB connector (6).

A printed circuit board is an assembly that facilities connecting electrical components by providing both the required electrical connections between electrical components and a substrate platform for physically mounting the electrical components. It is made of non-conducting material (i.e., plastic) that provides the physical anchoring. Embedded in the non-conducting material are lines of conducting material (i.e., copper) that provide the necessary electrical connections between the various electrical components. In the context of the present invention, the functional components of inventive USB device, as described in FIG. 2, are mounted onto such printed circuit board and the components are connected via the data bus. Besides the important functional components, there are additional components, hereon referred to as "ancillary components," that are present on a printed circuit board. These ancillary components are needed to support the function of the main functional components and include, but are not limited to, capacitors, resistors, and an oscillator. One ordinarily skilled in the art will understand the contribution ancillary components have on a device such as the inventive USB device.

A resistor is a standard electronic component that provides resistance to current flow. Using the SI unit system, a resistor is characterized in units of Ohms.

A capacitor is a standard electrical device characterized by its capacity to store an electric charge.

A clock signal is a signal that alternates between two known states after a known and stable period of time. The source of the signal can include a wide range of physical phenomena including traditional pendulums, planetary motion, or atomic decay. In an electrical circuit, the uses of a clock signal include timing the length of events or time synchronizing the operations of various subunits of an electrical circuit.

An oscillator is any of a multitude of devices that provide a clock signal. One common oscillator used in electric circuits is a small piece material with certain physical properties (such as quartz, crystal or ceramic) that resonates at a known frequency when subjected to an applied voltage.

A data bus is any of a variety of means of using conductors to pass signals and information between the components of an electrical device.

A unique identifier (ID) is a number that is distinct and does not repeat itself. In the context of the inventive USB device, an ID serves to identify a specific inventive USB device, thereby distinguishing it from other similar inventive USB devices. The ID is also the data that is transmitted from a first inventive USB device to a second target inventive USB device. This ID is associated with additional information relevant to the first inventive USB device (e.g., contact information, product information, or company information) that is stored in a remote server. This additional information is hereon referred to as "associated information" since it is associated with the ID of the first inventive USB device that has been received by the second inventive device. This associated information may be provided by the user of the first inventive USB device before or after he or she sends the inventive USB device's ID to other target inventive USB devices. After receiving IDs from other inventive USB devices, the inventive USB device is expected to have had stored a list of IDs from these other inventive USB devices. A user then can retrieve associated information connected to such IDs by interfacing the target inventive USB device with a client computer and accessing associated information stored at a remote server. This is done by 1) joining the USB connector on the inventive USB device with a USB port on a client computer and 2) logging onto a remote server, via the Internet or Intranet, which links the uploaded ID with associated information related to the same ID. This associated information can be sorted and organized and stored at the remote server or downloaded into the user's client computer. The ID for each inventive USB device is embedded into a non-volatile storage medium, ROM, in the microcontroller and may be, but not limited to, a 64-bit number stored on the non-volatile storage of the inventive USB device, giving 18,446,744,073,709,551,616 IDs. Preferably, the ID for each inventive USB device is assigned randomly. At the very least, this ID cannot be assigned sequentially. Sending of an ID from a first inventive USB device to a second target inventive USB device can be achieved via wireless transmission, which will further described in this application. The invention provides that data being received from other inventive USB devices comprises but not limited to IDs. The approach of sending and storing only IDs reduces the complexity of the user interface to a minimum and decreases the amount of memory required for storing data from other inventive USB devices, thereby reducing production cost for each inventive USB devices. It may be preferable to have, in addition to an ID, a time stamp field associated with each ID to reflect the time in which an ID had been received. Further, it may be preferable to have a memo data field for manual data entry of information related to each ID. Further, it may be preferable to have an additional field for audio data related to each ID.

A power source can be any means to provide voltage, current, and energy to an electric circuit. In the context of this invention, it provides power for the inventive USB device to work for an extended period of time. It can be a battery, rechargeable from the power from the USB connection, a solar cell, or functional equivalents.

A microcontroller is a combination of a microprocessor, scratch RAM, and ROM storage into one unified integrated circuit.

A microprocessor is an integrated circuit semiconductor that performs the bulk of the processing and controls the parts of a system. They use a known set of programmable rules to interpret received input electrical signals and to control other elements of an electrical circuit by generating output electrical signals.

Read Only Memory (ROM) is a type of electronic storage that stores binary data which is manufactured with fixed contents. The data can later be read and accessed but not changed. ROM is inherently non-volatile storage as it retains its contents even when disconnected from a power source. In its most general sense, the term might be used for any binary data storage system whose contents cannot be altered, such as a DVD-ROM or CD-ROM. The inventive USB device, however, uses semiconductor integrated circuits as the storage medium. The inventive USB device's ROM 1) stores the unique identifier and 2) stores the microcode or program code that specifies how the on-board microcontroller will respond to various input signals.

Random Access Memory (RAM) is a type of electronic storage holding binary data than can be read, accessed, and changed. RAM can be either volatile or non-volatile. In the context of the invention, the inventive USB device uses semiconductor integrated circuits as the storage medium.

Non-Volatile is used to describe an electronic component that retains its state and/or contents even when not connected to a power source. In the context of the invention, non-volatile RAM is used to store IDs received from other inventive USB devices so that data will not be lost when there is no power source.

Volatile is used to describe an electronic component that loses its state and/or contents when not connected to a power source. In the context of the invention, volatile RAM is used to provide temporary storage on the inventive USB device.

Scratch RAM is a term used to describe a small amount of volatile RAM used as temporary storage by a microprocessor.

Program ROM is a term describing ROM dedicated to storing the program code or microcode. It is a set of instructions that specify how the on-board microcontroller will respond to various input signals. Among many tasks, these instructions will coordinate the sending/receiving of IDs, alerting users of the inventive USB device's internal state, and transferring information to/from a client computer.

Universal Serial Bus (USB) is an external peripheral interface standard for communication between a computer and external peripherals over an inexpensive cable using bidirectional serial transmission.

A USB controller is a microcontroller that contains the program code necessary to implement the USB standard.

A USB connector is the physical means a device uses to interconnect with another device, such as a personal computer, that can be communicated via the USB standard and having a USB port. This connector must meet the physical/electrical standards specified in the USB standard. This is the physical component of an inventive USB device which will interface with a USB port on a personal computer such as the client computer (e.g., a personal computer, a PDA, or a visual terminal).

A USB port on a client computer (e.g., a personal computer) is an interface, like serial and parallel port, to which one can connect a peripheral device, such as a mouse, keyboard, flash memory drive, or the subject inventive USB device invention. In the context of the current invention, the USB port provides an inventive USB device's access to a client computer by joining the USB connector on the inventive USB device with the USB port on the client computer.

A Client computer is a computer which will be reading the device. It may be a personal computer, a PDA, or a visual terminal. The client computer has the following requirements: 1) has a USB port 2) connected to the Internet, to the Intranet, or have means to access a remote server.

Program Code is a set of instructions used by a microprocessor that describes the microprocessor's reaction to various input electrical signals. These instructions are used to run a program. There are at least three separate programs that are created for an inventive USB device to send its ID to other target inventive USB devices and store IDs received from other inventive USB devices, to communicate with a client computer upon joining of the inventive USB device's connector with the client computer's USB port, and to link to associated information stored on a remote server. These programs involved in the transfer of data reside in the following: 1) a microprocessor on-board the inventive USB device, 2) a client computer, and 3) a remote server.

Program Code on Program ROM Stored in Inventive USB Device

Contained on the program ROM of the microcontroller on the printed circuit board in the inventive USB device is a set of instructions that specify how the on-board microcontroller will respond to various input signals. Among many tasks, these instructions will coordinate the sending/receiving of IDs, alerting users of the inventive USB device's internal state, and transferring information to/from a client computer.

Program Code on Client Computer

When the user decides to use the data contained on the inventive USB device, they will plug the inventive USB device into the USB port of a computer. This computer is the 'client' computer. Code on the client computer has 2 main parts:

Part 1: Code must be written in order for the client computer to read the data off the inventive USB device. Code of this type (i.e., code that mediates a PC's communication with some foreign device) is called a device driver. The device driver will take care of the PC's half of the USB communication process. Different device drivers must be written for each PC operating system platform. Such drivers may be downloaded from a website and run on the client computer. However, if the inventive USB device is a mass storage device, such driver is built into the device and is can be successfully read by any PC operating system.

Part 2: Code must be written to mediate the process of sending data (via the Internet) to the server. This includes getting the username/password from the user, authenticating the user, and sending the actual data. Like the device driver, this code may be downloaded from the web site or it may be embedded into the inventive USB device provided that the inventive USB device is a mass storage device. Such embedded file may be an AutoRun program, a web link, or both.

Program Code on Remote Server

All the IDs stored on the inventive USB device will be transferred to a remote computer (via the internet or intranet) and stored. This remote computer (or collection of computers) is the server. The functions of the server code are:

Part 1: Communicate with the Client Computer Code to accept IDs read from an inventive USB device, store them, and to do basic user authentication.

Part 2: Web interface so user can browse the uploaded information easily using a standard web browser.

Wireless communication is any of a multitude of ways to communicate electrical signals excluding transmission via direct physical contact of electrical conductors. Sound waves and electromagnetic radiation are common mediums for Wireless transmission. Electromagnetic radiation of any frequency can be used. Typically frequencies in the infrared, visable, or radio portion of the electromagnetic spectrum are chosen as communication mediums. Preferably, nonspecific transmission of the ID to another unintended inventive USB device is minimized by limiting both the intensity and angular spread of the wireless communication signal.

User feedback provides any of a number of ways to communicate the internal state of an electrical device in a way directly discernable to the human senses. User-feedback may be provided by an indicator on the inventive USB device. An indicator may be a component on inventive USB device that indicates to a user, either by audio, tactile, or visual reporting, that the device is in a specific internal state or that it has performed a specific function. A visual indicator may be a small light, such as a LED that can flash, and other functional equivalents thereof that serves the same reporting mechanism. An audio indicator may be a low power audio device such as a piezo-electric device that can beep, and other functional equivalents thereof that serves the same reporting mechanism. In the context of this invention, an indicator on a target inventive USB device may report to a user that an ID from another inventive USB device has been successfully received. The device may further provide additional reporting to the user the inventive USB device's internal state that affects the inventive USB device's ability to function. Examples of these internal states include lack of storage on the device, inventive USB device is broken, or that battery is low in power.

A diode is a semiconductor device which, within the tolerances of the device, conducts electric current in one direction only.

Light Emitting Diode (LED) is a diode that emits electromagnetic radiation (light) as current flows through the allowed direction. In the context of the present invention, LED is a visual indicator providing a user feedback on a specific internal state of the device.

An infrared transceiver is an electrical component for transmitting and receiving infrared. It contains both a transmitter (e.g., an infrared LED) and a receiver (e.g., phototransistor). In the context of the present invention, the inventive USB device has an infrared transceiver.

Infrared Light Emitting Diode (LED) is a Light Emitting Diode that emits electromagnetic radiation in the frequency range just below visible light and corresponding to radiated heat. Preferably, the infrared LED used in the invention to transmit data is at an intensity that enables a short transmission range approximately, but not limited to, 1 foot between a first inventive USB device and a second inventive USB device) and LED beam angle is narrow (around 30 degrees).

A first embodiment of the invention is directed to an inventive USB device that receives data from other data transmitting devices wherein the data received comprises unique identifiers (IDs). The inventive USB device comprises a printed circuit board having a microprocessor and memory, a USB controller connected to the microprocessor, a USB connector connected to the printed circuit board, and wireless receiving means connected to the printer circuit board for receiving external data to be stored in the memory. The data stored in the memory include, but are not limited to, unique identifiers from external devices. The inventive USB device may further comprise means for transmitting data from the device to external devices. For its receiving and transmission means, the device has a transceiver such as an infrared transceiver or a radio frequency transceiver. The inventive USB has a power source to provide power for it to work for an extended period of time. This power source can be a battery, rechargeable from the power from the USB connection, a solar cell, or functional equivalents. The above inventive USB device may further provide means for a user to initiate the device to transmit the ID to other receiving devices within the proximity. An example of such means for initiating is a button on the inventive USB device for a user to initiate the transmission by pushing the button. Examples of other receiving devices include cellular phones, personal digital assistants (PDAs), personal computers, personal information managers, bard-coding and ID tagging systems, or visual terminals. The inventive USB device may be modified into a USB mass storage device. First, each inventive USB device has a microcontroller comprising 1) a microprocessor that supports and interfaces with and controls the other components on the inventive USB device via the data bus, 2) Read Only Memory (ROM) which is written with microcode to drive the microprocessor and permanently printed with a ID identifying the inventive USB device and, 3) Volatile random access memory (RAM) providing scratch space for the microprocessor code. Second, each inventive USB device contains a data bus connecting such microcontroller to other functional components on the device. Third, each inventive USB device has connected to the microprocessor, via the data bus, non-volatile RAM. This non-volatile RAM stores IDs received from other inventive USB devices. Fourth, each inventive USB device has means for receiving data from other transmitting devices wherein the data received comprises unique identifiers (IDs). Sound waves and electromagnetic radiation are common mediums for wireless transmission. Electromagnetic radiation of any frequency can be used. Typically frequencies in the infrared, visible, or radio portion of the electromagnetic spectrum are chosen as communication mediums for wireless transmission. Applicant intends to encompass within the language any structure presently existing or developed in the future that performs the same function. Means providing infrared transmission and reception is provided by an infrared transceiver having 1) a transmitter such as an infrared LED and 2) a receiver such as a phototransistor. Alternatively, infrared transmitting means is provided by a transmitter such as an infrared light emitting diode (LED) and infrared receiving means is provided by a receiver such as a phototransistor. The infrared LED is interfaced with the microprocessor via the data bus. Preferably, the infrared LED used in the invention to transmit information is at an intensity that enables a short transmission range (approximately, but not limited to, 1 foot between a first inventive USB device with a second inventive USB device). The LED beam angle may be narrow (approximately 30 degrees). Fifth, each inventive USB device has a USB connector that serves as the physical means the device uses to interconnect with a USB port on a personal computer. Sixth, each inventive USB device contains a USB controller that contains the program code necessary to implement the USB standard. Such USB controller can exist in the microprocessor or can exist in a separate component external of the microcontroller but is interconnected to the microcontroller via the data bus.

The inventive USB device described above may further provide user feedback means, such as an indicator on the device, to report to the user when a unique identifier (ID) from another inventive USB device has been successfully received. The inventive USB device may further provide additional feedback means to report to the user the inventive USB device's internal state that affects its ability to function. Examples of these conditions include lack of storage on the inventive USB device, inventive USB device malfunction, or that the power source is low in power. Such indicator is also interfaced with the microprocessor through the data bus and may be audio or visual. A visual indicator may be a small light, such as a LED that can flash, and other functional equivalents thereof that serves the same reporting mechanism. An audio indicator may be a low power audio device such as a pesio-electric device that can beep, and other functional equivalents thereof that serves the same reporting mechanism. A tactile indicator may be an electric device that cause vibration, and other functional equivalents thereof that serves the same reporting mechanism.

The invention provides that data being received from other inventive USB devices comprises IDs. The intention of having data transmitted to comprise at least IDs is to provide the flexibility of reducing the amount the storage space required on the inventive USB device. However, data transmitted may expand to audio, text, and image files. It may be preferable to, in addition to having IDs, to have a time stamp associated with each ID received to reflect the time in which ID had been received. Further, it may be preferable to have an additional field for audio data related to each ID.

To ensure effective data reconstruction of the stored IDs in the event a device is lost or misplaced, the inventive USB device may further be equipped with a mechanism to automatically send its ID, in the form of a "sent ID," upon receiving an incoming ID. Such "sent ID" might be marked with a flag or stored in a separate table. Further, the inventive device may further have the capability to store the "sent IDs" from other devices which it had sent its IDs to. The below example illustrates the importance of the new feature of sending and storing "sent IDs". User 1 had received IDs on his USB_device_1 from User 1001 and User 1002 but only User 1001's USB_device_1001 has ID 1 from User 1. User 1002 doesn't because she chose not to receive the information on her USB_device_1002. On USB_device_1, the received IDs include 1001 and 1002. If User 1 loses USB_device_1, the only received ID that can be retrieved is 1001 when User 1001 uploads his data. Because User 1002 did not receive an ID from User 1, data received from User 2 cannot be reconstructed. With the new feature of storing "sent IDs," User 1 will be able to retrieve IDs 1001 and 1002 which are marked as 1001X and 1002X. So long as User 1002 plug her device into the computer, data for User 1 can be reconstructed even though User 1002 did not receive the ID1. The designation X is to distinguish "sent IDs" from other IDs stored. It is important to note that the user will not be able to see the –X codes. Instead, he or she sees the same information as a user from the existing approach.

|  |  | EXISTING APPROACH |  | NEW FEATURE |  |
| --- | --- | --- | --- | --- | --- |
|  |  | USER 1 |  |  |  |
| Received | Sent | On device 1 | Seen by User | On device 1 | Seen by User |
| 1001 | 1001 | 1001 | 1001 | 1001 | 1001 |
| 1002 |  | 1002 | 1002 | 1002 | 1002 |
|  |  |  |  | 1001X |  |
|  |  |  |  | 1002X |  |

-continued

| | | EXISTING APPROACH | | NEW FEATURE | |
|---|---|---|---|---|---|
| USER 1001 | | | | | |
| Received | Sent | On device 1001 | Seen by User | On device 1001 | Seen by User |
| 1 | 1 | 1 | 1 | 1<br>1X | 1 |
| USER 1002 | | | | | |
| Received | Sent | On device 1001 | Seen by User | On device 1002 | Seen by User |
| NA | 1 | NA | | 1X | |

It should be noted that the inventive USB device may function without the USB connector and controller by equipping if the device is equipped with wireless means to upload the stored data in its memory to a client computer. Such modification might be necessary for USB devices to be affixed to products as opposed to being carried by users.

Figure 1:
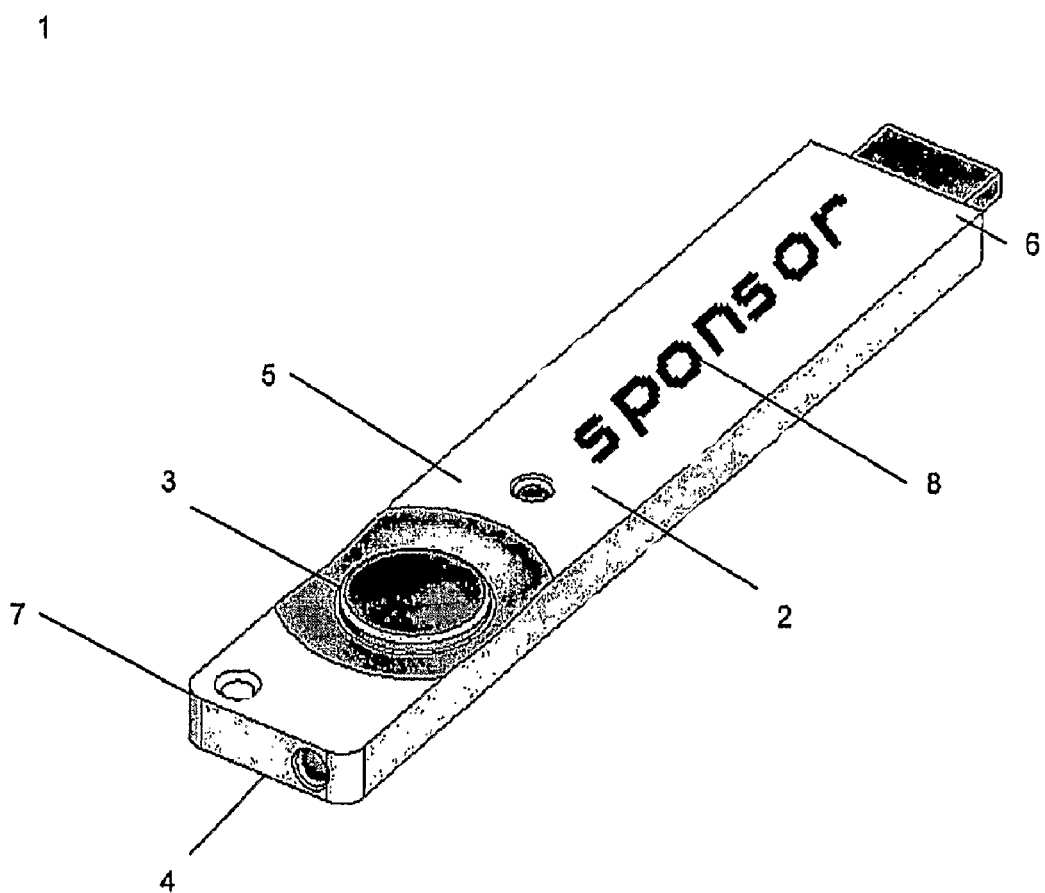
FIG. 1 provides a perspective front view of the inventive USB device (1). The majority of the functional components described in FIG. 3 are encapsulated by an external case (2) and therefore not apparent to the user. The few functional components that are apparent include a "Transmit ID" button (3), an infrared LED (4), an on-device user feedback indicator LED (5), and a USB connector (6). This connector (6) connects to a USB port (not shown) on a client computer (not shown). In addition to the functional components, the device (1) contains a keychain hole (7) which is used for it to be conveniently joined to a keychain. Further, the device (1) contains a graphic image (e.g., sponsor) of (8) printed on external case (2).
Figure 3:
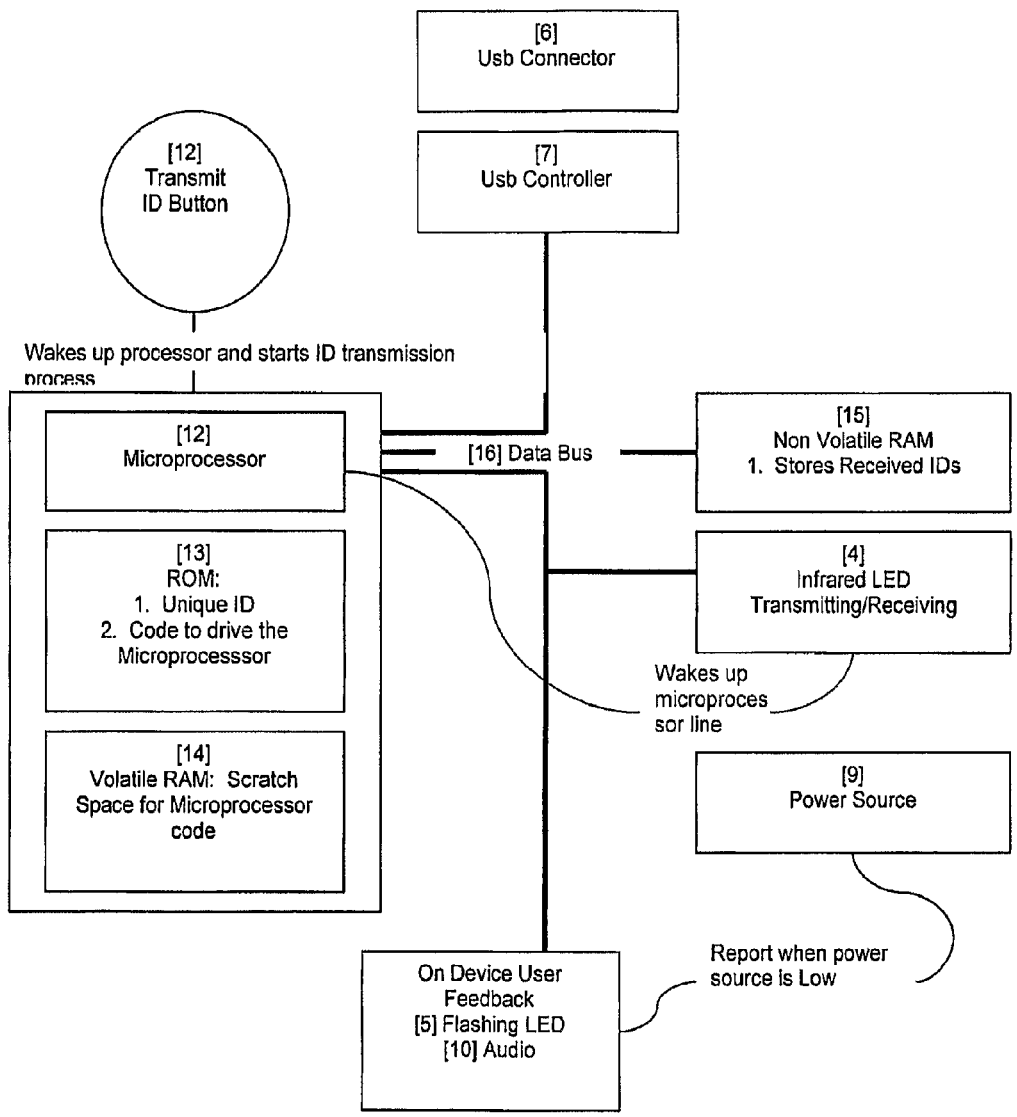
FIG. 3 provides a diagram of the functional components of the inventive USB device and the means to which they are interrelated. Components that are apparent to the user include the USB connector (6), the "Transmit ID" button (3), the infrared LED (4), the on-device user feedback indicator LED (5), an audio indicator (10), and battery closure (9) or power source. Other components that are not apparent but are to the intended function of the device include a microcontroller (11) containing at least a microprocessor (12), ROM (13), and volatile RAM (14). Additional components to the device include nonvolatile RAM (15), data bus (16), and USB controller (17).

The inventive USB device has the combined components on a printed circuit board, as described in FIG. 3. An illustration of the inventive USB device is available in FIG. 1 and FIG. 2 where the majority of the functional components described in FIG. 3 are encapsulated by an external case.

A second embodiment of the invention is directed to a method comprising the steps of: 1) receiving data via wireless means in a USB device having a USB connector and a USB controller from other data transmitting devices, 2) uploading the data stored in the USB device to a client computer, such as a personal computer, by a physical connection approach or a wireless communication approach. The data stored include but not limited to unique identifiers. The physical connection for uploading the stored data include joining the USB connector on the USB device with a USB port on a client computer or joining the USB connector on the USB device to a USB cable connected to the client computer. The method may further include associating the uploaded data in the client computer to information associated with each ID wherein the associated information is stored in a database or a remote server. The method may further include 3) transmitting the USB device's ID to other data receiving devices.

Mode of Operation

Example 1

Figure 4:
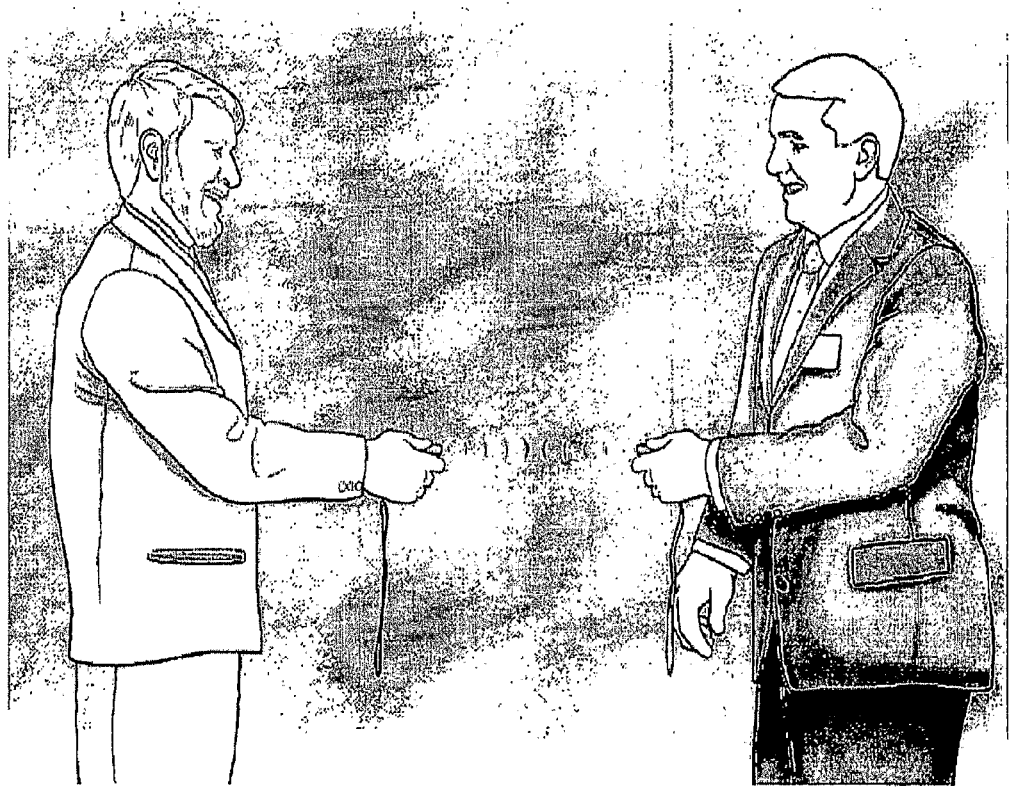
FIG. 4 illustrates the use of the inventive USB device to obtain contact information.

Illustrates the Use of Inventive USB Devices Between Users to Exchange Information As shown in FIG. 4, User 1 and User 2 interact and both users have inventive USB devices. Only User 1 wishes to send his information to User 2. User 1 points inventive USB_device_1 at User 2's target inventive USB_device_2 and pushes the "Transmit ID button" on inventive USB_device_1. An indicator on User 2's inventive USB device 2 reports to User 2 that ID_1 has been successfully received in inventive USB_device_2.

Example 2

Figure 5:
FIG. 5 illustrates the use of the inventive USB device to obtain product information.
Figure 6:
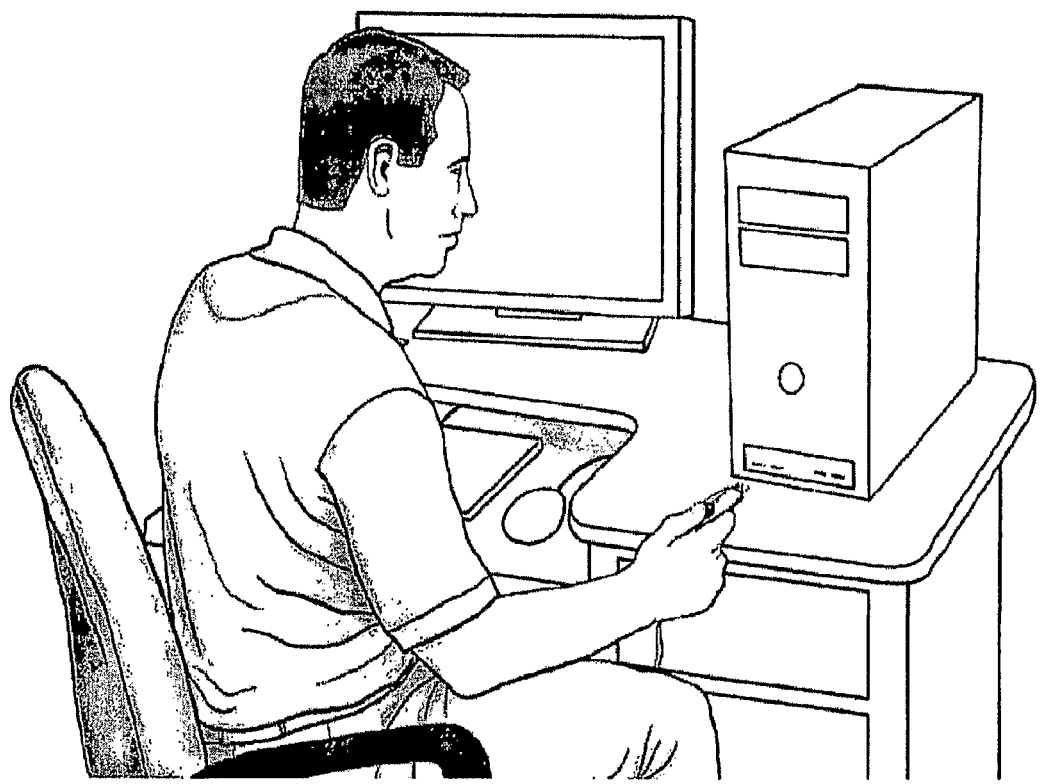
FIG. 6 illustrates the user connecting the USB device to a personal computer by connecting the USB connector on the inventive device to the USB port on the personal computer.

Illustrates the Use of Inventive USB Device to Obtain Information about a Product As shown in FIG. 5, User 3 realizes that she's interested in a product User 1 has, Product 4, and wishes to obtain such information. Product 4 has inventive USB_device_4, in the design of a product tag. User 3 then takes inventive USB_device_3 and points it at Product 4's USB_device_4, and pushes the "Transmit ID button" on USB_device_3. An indicator on Product 4's USB_device_4 reports to User 3 that it has received an incoming ID_3. Upon receiving ID_3, USB_device_4 automatically sends its ID_4 to USB_device_3. User 3 walks away from Product 3 with stored ID 3 and ID 3X.

Example 3

Between a User and a Company

User 2 then stops by a companies display booth and wishes to both obtain information on Company 5 and wishes to put down his information for Company 5 to further send promotional items to him. User 2 approaches inventive USB_device_5, in the design of a table top device, at the booth and points his own inventive USB_device_2 at inventive USB_device_5 and presses the "Transmit ID button" on inventive USB device 2. An indicator on USB_device_5 reports to User 2 that ID_2 has been successfully received in USB_device_5. Further, USB_device_5 automatically sends it's ID_5 upon receipt of ID_2. Again, an indicator on USB_device_2 reports that ID_5 has been successfully added.

Example 4

Between a User and Another User Who Lost Information the Device

User 2 then runs into User 6 whom he wishes to exchange personal information with. User 6 has USB_device_6 having ID_6. Both of them exchanged corresponding IDs using their USB devices. At the end of the interaction, User 2's inventive USB device 2 has ID_1, ID_3, ID_4, ID_5, and ID_6. When User 2 wishes to obtain associated contact information for User 1 and his Product 3, Product 4, and Company 5, he plugs USB_device_2 into a personal computer's USB port. User 2 is then interfaced with a remote server via the Internet. Because he hasn't registered the associated information for USB_device_2, a screen prompts for information to be entered for USB_device_2. User 2 then is asked whether information is for a company, an individual, or a product. Such preference then dictates the field to which data can further be entered. User 2 indicates on the screen that inventive USB_device_2 is used to identify an individual, himself. He is prompted with his basic contact information (first name, company, address, city, state, zip and additional fields as so wished by the user), which will be provided to other inventive USB devices that have ID_2 stored. He has the option to provide additional information for his recipients. Examples of levels of information released, besides basic information, include personal, descriptive business, and extensive business wherein: 1) personal information represents information such as his hobbies, interests, pictures, multimedia, email address, 2) descriptive business information represents information such as company's business, photos, multimedia, its product line, a company brochure stored on the server and 3) extensive business represents more detailed information such as a company's partnering interest in addition to the information on descriptive business. In addition, User 2 is asked for a login and password, which provide him access to his contact management page on any Internet browser without having to plug the inventive USB device into a personal computer. On the web browser, User 2 sees a marketing message for a sponsor of the event he attended. In the same browser, he also sees the associated data from the stored IDs with the following basic information:

TABLE 1

| ID | Source | Displayed to User 2 | Type of Information Provided by User 2 | What Source Sees |
|---|---|---|---|---|
| ID 1 | User 1 | First Name, Last Name, Company Name, Website, Picture | N/A | Login Name 1 |
| ID 3 | Product 3 (from User 1) | Not yet entered | N/A | Login Name 3 |
| ID 4 | Product 4 | Product ID, Title, Description, Cost | N/A | Login Name 4 |
| ID 5 | Company 5 | Company Name Website, Phone Number | Basic Information | Basic Information |
| ID 6 | User 6 | Basic Information | Personal Information | Login Name |

User 2 is then notified by User 6 who has previously registered her device but had lost her USB_device_6. User 6 asked if User 2 is the whom she met since all she can see in her contact management website that there are 2 login names, Login 2 and Login X, that are downloading her contact information since she doesn't have IDs the IDs to associate to their information. She then asked User 2 to provide, through a feature on the Contact Management software, her with his information. User 2 agrees and specifies his "Personal Information" be sent to User 6.

Designs

The described inventive USB device may be in the form of a portable device, a table-top device, or a tag depending on the different applications which the inventive USB device may be used in. In the portable configuration, the inventive USB device may be a keychain, a card, a bracelet, or a pen. The inventive USB device may be less than 3 ounces. In the table-top configuration which is appropriate for a specific location, such as a company's front-desk or a booth, the inventive USB device may be a stand-alone apparatus or one that interfaces with the USB port on a personal computer or lap-top, providing a fixed area for wireless transmission for other inventive USB devices to send IDs. In the tag configuration, the inventive USB device is made small and conveniently enough to be positioned onto a product. Additional features on each inventive USB device may be implemented depending on the different configurations. For example, in the keychain configuration, one may add additional features that may be desirable to the user to encourage inventive USB device being carried around often, Examples of additional features include a FM/AM radio, a MP3 player, a compass, a clock, and a flashlight.

Substitution with Other Mechanisms of Interfacing with a Client Computer

The disclosure describes in detail a mechanism of interface between the inventive USB device and a client computer whereby such mechanism is enabled by a USB controller/connector on the inventive USB device and a USB port on a client computer. Such mechanism of interface can be substituted using Firewire technology, IRDA, parallel port, and other mechanisms of interfacing with a client computer. Analogous to the USB system in the current invention, the communication between the device with a new substituted platform and a client computer is enabled by having a controller and a connector (specific to the type of data transfer) on the device and an analogous port which interfaces with such connector on a client computer.

Applications

The device may have different applications that can be separated into two categories: social interaction and product/company information acquisition. Under the social interaction category, one of the applications is using the inventive USB device for an electronic substitute for business cards. In addition to exchanging contact information as in the case of traditional cards, the inventive USB device may be used to obtain product information which is labeled with another inventive USB device associated with a specific ID. The invention therefore a cost-effective and environmentally friendly solution that enables a convenient way to send and receive data between similar devices that provides the following advantages: 1) a mechanism for a user (a provider or a recipient) to track the other user (conversely a recipient or a provider) even if a device is lost or misplaced 2) a method to keep information updated after it has been provided to a recipient 3) not limited by the physical availability of printed materials and not burdened with the need to carry such materials 4) flexibility in type of data exchanged and extensiveness of data exchange 5) ability to customize information provided to a recipient subsequent to the exchange of data.

Additionally, the device may be used to obtain product information, thereby replacing the conventional practice of writing a product's ID and description on a slip of paper. Such practice is prevalent in stores where the product is too large for the customer to carry within the store. These items can be furniture pieces, equipments, stereo systems, and others.

Further, the device may be used in a museum where a visitor can obtain exhibits or paintings of interest and obtain educational materials or souvenirs on such pieces when he or she leaves the museum.

The device may also be useful for inventory control and for providing ticket, passenger, and luggage information at airports, train stations, and other transportation sites. The device may also be useful to provide a purchase order at frequent visits such as coffee shops.

The inventive USB device may also be used for hands-free shopping in high tourist traffic locations (e.g., cruise, tourist attractions, outlet shopping malls). As opposed to the traditional method where a visitor has to bring bags and bags of souvenirs from one location to the next, the device provides a visitor with the luxury to do hands free shopping. At the end of the shopping spree or at intervals so wished by the visitor, the visitor may interconnect his or her device into a nearby client computer or a personal computer at home to upload the product information he or she obtained to make the online purchase. This obviates the need for carrying bags of consumer products from one store to the next or from one location to the next.

The invention further provides a mechanism to turn new home developments into furniture and interior design galleries, displaying furnishings and interior designs. The inventive USB device provides an enabling technology for attendees (potential home buyers) at open houses the opportunity to obtain information on a specific home. Further, it provides a mechanism to obtain furniture that is of interest displayed in such locations. For the real estate broker, this provides a mechanism to consistently be in contact with the potential buyer and to notify buyer of new available homes or new developments on leads. The utility of this device in this application enables home brokers to capitalize on 1) value of an estate until home is purchase since it is now used as a gallery or showroom displayed with furnishings for sale and interior design services 2) opportunity to obtain free furnishing and interior decoration for free. For the furniture provider or interior designer, this provides an opportunity to obtain maximum exposure (since these developments are visited frequently and publicized by brokers) to a targeted audience, home buyers who are likely to furnish their homes.

The invention also provides methods for advertising information using the inventive USB device. One is printing of a graphic, such as that of a company (i.e., sponsor) or a product name (i.e., product from a sponsor) onto the device that corresponds to a group of inventive USB devices. For example, the logo of Company A is printed on inventive USB devices with IDs 1 to 1,000 and the logo of Company B is printed on inventive USB devices with IDs 1,001 to 10,000. These other method of advertising involves displaying on the user interface that communicates with the server (e.g., web browser). Such advertising on the user interface is based on 1) the actual ID of an inventive USB device. Other methods of advertising can be non-ID specific and can be displayed to a user while the device is communicating to the remote server.

Advertising Message Based on the ID of an Inventive USB Device

The method of using the ID of an inventive device is provided as an advertising message for a specific ID that logs into the remote user from respective client computers. For example, Company C is displayed on the web browser of IDs from 1 to 1,000 when IDs 1 to 1,000 communicates to the remote server and Company D is displayed on web browser of IDs from 1,001 to 10,000.

Advertising Message Based on the Received IDs of an Inventive USB Device

The method of advertising using "received IDs" involves displaying on the browser specific marketing messages that correspond to specific received IDs. For example, Company X corresponds to specific ID 20,000 and has a marketing message such as its new product line. For all inventive devices with ID 20,000 in their list of received IDs receives a display of information on the web browser.

Advantages

The device provides the following advantages: 1) scalability on the amount of data transferred between inventive USB devices 2) scalability in the information provided for each inventive USB device 2) flexibility on the type of data transferred (contact information, product information, company information) 3) ease in interacting with a personal computer 4) portability 5) ability for the provider to customize the information 6) low cost of manufacturing. The first three advantages are important to the end user. The low cost manufacturing of the device provides means for the device to be distributed as a marketing material.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

The invention claimed is:

1. A lightweight USB mass storage device comprising:
   a printed circuit board having a microprocessor, a first non-volatile memory storing a first unique identifier of the lightweight USB mass storage device, and a second volatile memory storing at least one second unique identifier received from one or more capable external devices;
   a USB controller connected to said microprocessor;
   a USB connector connected to said printed circuit board;
   an internal power source means for maintaining operations of the lightweight USB mass storage device;
   a wireless transceiver receiving the at least one second unique identifier from the capable external devices to be stored in said second volatile memory, wherein said wireless transceiver is connected to the printed circuit board;
   means for indicating a status of the lightweight USB mass storage device;
   a transmit identifier means for initiating the wireless transceiver to transfer the first unique identifier from the lightweight USB mass storage device to said capable external devices; and
   means for uploading said first unique identifier and said at least one second unique identifier to a client computer upon establishing a connection between the lightweight USB mass storage device and the client computer, wherein the client computer provides associated additional information for each said uploaded at least one second unique identifier from a database of a remote server via a network after a user successfully authenticated to download the associated additional information from the remote server;
   wherein the remote server realizes the associated additional information from associations of the uploaded said first unique identifier and said at least one second unique identifier.

2. A method for a lightweight USB mass storage device comprising:
   storing, in a first non-volatile memory, a first unique identifier of the lightweight USB mass storage device, and storing, in a second volatile memory, at least one second unique identifier received from one or more capable external devices;
   maintaining operations of the lightweight USB mass storage device with an internal power source;
   receiving, via a wireless transceiver, the at least one second unique identifier from the capable external devices to be stored in said second volatile memory, wherein said wireless transceiver is connected to a printed circuit board;
   indicating a status of the lightweight USB mass storage device;
   initiating the wireless transceiver to transfer the first unique identifier from the lightweight USB mass storage device to said capable external devices; and
   uploading said first unique identifier and said at least one second unique identifier to a client computer upon establishing a connection between the lightweight USB mass storage device and the client computer, wherein the client computer provides associated additional information for each said uploaded at least one second unique identifier from a database of a remote server via a network after a user successfully authenticated to download the associated additional information from the remote server;
   wherein the remote server realizes the associated additional information from associations of the uploaded said first unique identifier and said at least one second unique identifier.

3. The device defined in claim 1, wherein said transceiver comprises a transmitter connected to said microprocessor for transmitting data.

4. The device defined in claim 1, wherein said transceiver is selected from the group consisting of infrared transceiver and radio frequency transceiver.

5. The device define in claim 1, wherein said transmit identifier means is a button.

6. The device defined in claim 1, wherein said at least one second unique identifier is uploaded to the client computer by joining said USB connector on said lightweight USB mass storage device to a USB port on said client computer.

7. The device defined in claim 1, wherein said at least one second unique identifier is uploaded to the client computer by joining said USB connector on said lightweight USB mass storage device to a USB cable connected to said client computer.

8. The device defined in claim 1, wherein said at least one second unique identifier is uploaded to the client computer by the wireless transceiver.

9. The device defined in claim 1, wherein said client computer comprises a personal computer, a personal digital assistant (PDA), a visual terminal, a cellular phone, personal information manager, barcoding and ID tagging system, databases, or visual terminals.

10. The device defined in claim 1, wherein said device weighs less than three ounces.

11. The device defined in claim 1, wherein said device is encapsulated in a case printed with a graphic or a logo.

12. The device defined in claim 1, wherein said device is encapsulated in a case printed with text.

13. The device defined in claim 12, wherein said text comprises at least one of a name of a company, or a name of a product.

14. The device defined in claim 1, wherein said client computer displays an advertising message.

15. The device defined in claim 14, wherein said advertising message is displayed based on the first unique identifier.

16. The device defined in claim 14, wherein said advertising message is displayed based on user information associated with the first unique identifier.

17. The device defined in claim 14, wherein said device further comprises means for automatically sending the first unique identifier upon receipt of the at least one second unique identifier from said capable external devices.

\* \* \* \* \*